219-121 SR

12/16/86 XR 4,629,940

United States Patent [19]

Gagne et al.

[11] Patent Number: 4,629,940

[45] Date of Patent: Dec. 16, 1986

[54] PLASMA EMISSION SOURCE

[75] Inventors: Peter H. Gagne, Brookfield; Peter J. Morrisroe, New Fairfield, both of Conn.

[73] Assignee: The Perkin-Elmer Corporation, Norwalk, Conn.

[21] Appl. No.: 585,807

[22] Filed: Mar. 2, 1984

[51] Int. Cl.[4] ........................ H05B 31/26; H03H 7/38

[52] U.S. Cl. .......................... 315/111.51; 315/111.21; 219/121 P; 219/121 PT; 219/121 PM; 333/32

[58] Field of Search ............... 333/32, 33; 315/111.51, 315/111.21; 219/121 P, 121 PV, 121 PT, 121 PW, 121 PM

[56] References Cited

U.S. PATENT DOCUMENTS

| | | | |
|---|---|---|---|
| 2,742,618 | 5/1956 | Weber | 333/32 |
| 2,745,067 | 5/1956 | True et al. | 333/32 |
| 2,981,902 | 5/1961 | Familier | 333/32 |
| 3,132,313 | 5/1964 | Alford | 333/32 |
| 3,958,883 | 5/1976 | Turner | 315/111.51 |
| 4,207,137 | 6/1980 | Tretola | 219/121 P |
| 4,373,581 | 2/1983 | Toellner | 333/32 |
| 4,482,246 | 11/1984 | Meyer et al. | 315/111.51 |

OTHER PUBLICATIONS

Davies et al, Processing New Zealand Titaniferous Sands in an Induction-Coupled Plasma Torch, Sep. 1970, 468-481.

*Primary Examiner*—David K. Moore
*Assistant Examiner*—M. Razavi
*Attorney, Agent, or Firm*—E. T. Grimes; F. L. Masselle

[57] ABSTRACT

An impedance matching network for continuously and automatically maximizing RF power transfer to a plasma emission torch includes a dual phase detector network. Signals from the detector network control, via a control unit, a variable impedance network.

1 Claim, 3 Drawing Figures

PLASMA EMISSION SOURCE

BACKGROUND OF THE INVENTION

The present invention generally relates to a plasma emission source and, in particular, relates to a source wherein the power transfer efficiency is continuously and automatically maximized.

Plasma emission sources are used to atomize and excite a sample to cause the emission of light at wavelengths which are characteristic of the atomic structure of the sample. The emitted light is detected and measured by a spectrophotometer to complete the analytical process.

In conventional plasma emission sources, radio-frequency (RF) energy is inductively coupled from an RF generator to a plasma torch. Liquid samples are mixed with a solvent, nebulized and delivered into the flame of the torch. Usually, the torch is an argon plasma discharge and the sample plus solvent is carried thereinto by a stream of argon.

As with any RF apparatus, the efficiency of the energy transferred from the RF generator to the load (i.e. the torch) is dependent on the impedance matching therebetween. Hence, modern plasma emission sources include an impedance matching network between the RF generator and the plasma torch.

As it happens, as well known, the impedance of the torch, specifically a loading coil, depends upon both the static and dynamic operating parameters of the plasma emission source. Some of the parameters affecting the impedance of the torch include: changes in the sample and/or solvent; the desired operating temperature of the torch and the efficiency of the nebulizer. To date such changes required the operator to manually fine tune the impedance matching network. In addition, the nebulizer flow adjustments were quite critical in order to help minimize the required manual tuning. Nevertheless, it is quite difficult to maintain the continuous maximum power transfer since these changes are usually dynamic and occur during the actual measuring time.

As a consequence, plasma emission sources presently require excessive RF power input levels to compensate for the relatively poor power transfer to the torch and require frequent readjustment, particularly when solvents are changed.

SUMMARY OF THE INVENTION

Accordingly, it is one object of the present invention to provide a plasma emission source which maximizes the energy transferred from an RF generator to a plasma torch.

This object is accomplished, at least in part, by a plasma emission source having an impedance matching network which continuously and automatically matches the impedance between the RF generator and the plasma torch.

Other objects and advantages of the present invention will become apparent to those skilled in the art from the following detailed specification read in conjunction with the appended claims and the attached drawing.

BRIEF DESCRIPTION OF THE DRAWINGS

The drawings, not drawn to scale, include.

DETAILED DESCRIPTION OF THE INVENTION

Figure 1:
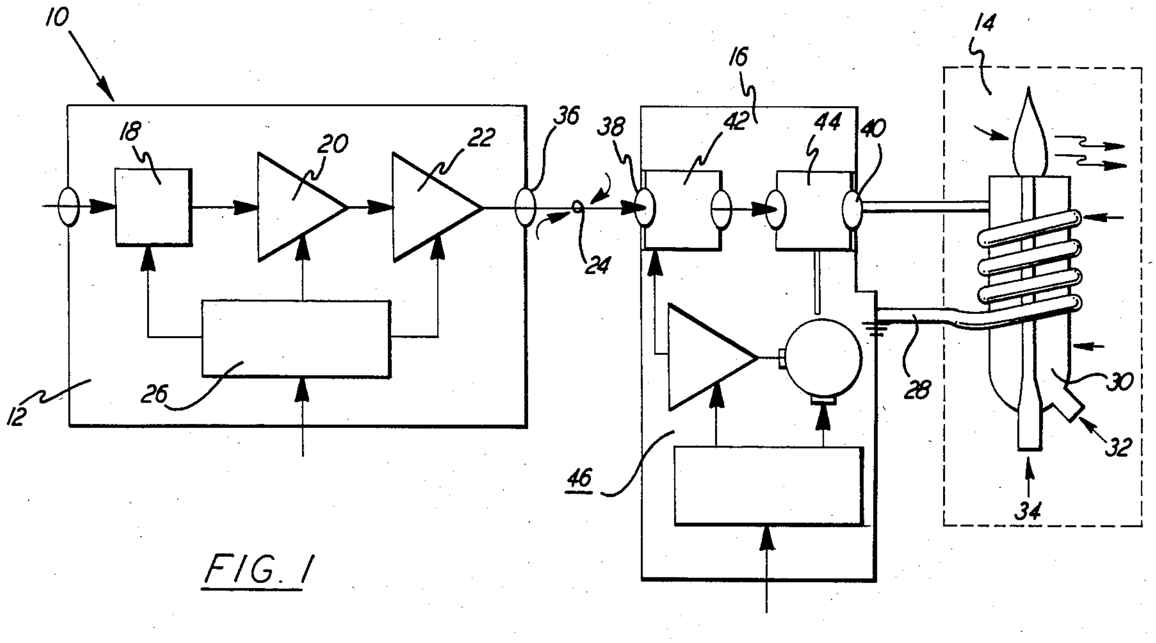
FIG. 1 which is a block diagram of a plasma emission source embodying the principles of the present invention.

A plasma emission source, generally indicated at 10 in the drawings and embodying the principles of the present invention, includes an RF generator 12 an argon plasma torch 14 and an impedance matching network 16 therebetween.

The RF generator 12, as shown in FIG. 1, includes a crystal control oscillator 18 which provides RF energy to a RF driver 20. The driver 20 delivers RF power to an RF power amplifier 22 which preferably has a 50 ohm output impedance. In the preferred embodiment the RF generator 12 is designed to supply between 200 to 2000 watts of RF power. In this embodiment the 50 ohm output is adapted to connect to a coaxial line 24. The oscillator 18, driver 20 and the power amplifier 22 are all driven via a DC power supply 26 which operates from rectified AC. The power supply 26 can either be a single unit with multiple outputs or can include more than one dedicated power supply.

The argon plasma torch 14 includes an RF loading coil 28 surrounding a glass torch chamber 30. The glass torch chamber 30 in this embodiment includes an argon inlet 32 and a sample mixture inlet 34. Preferably, the RF load coil 28 is 4 turns of ⅛ inch O.D. copper or stainless steel tubing and preferably has a low impedance. The RF generator 12 provides RF power to the load coil 28 of the plasma torch 14 via the impedance matching network 16. That is, the output 36 of the generator 12 is connected to the input 38 of the impedance matching network 16 and the output 40 of the impedance matching network 16 connects directly to the load coil 28.

Figure 2:
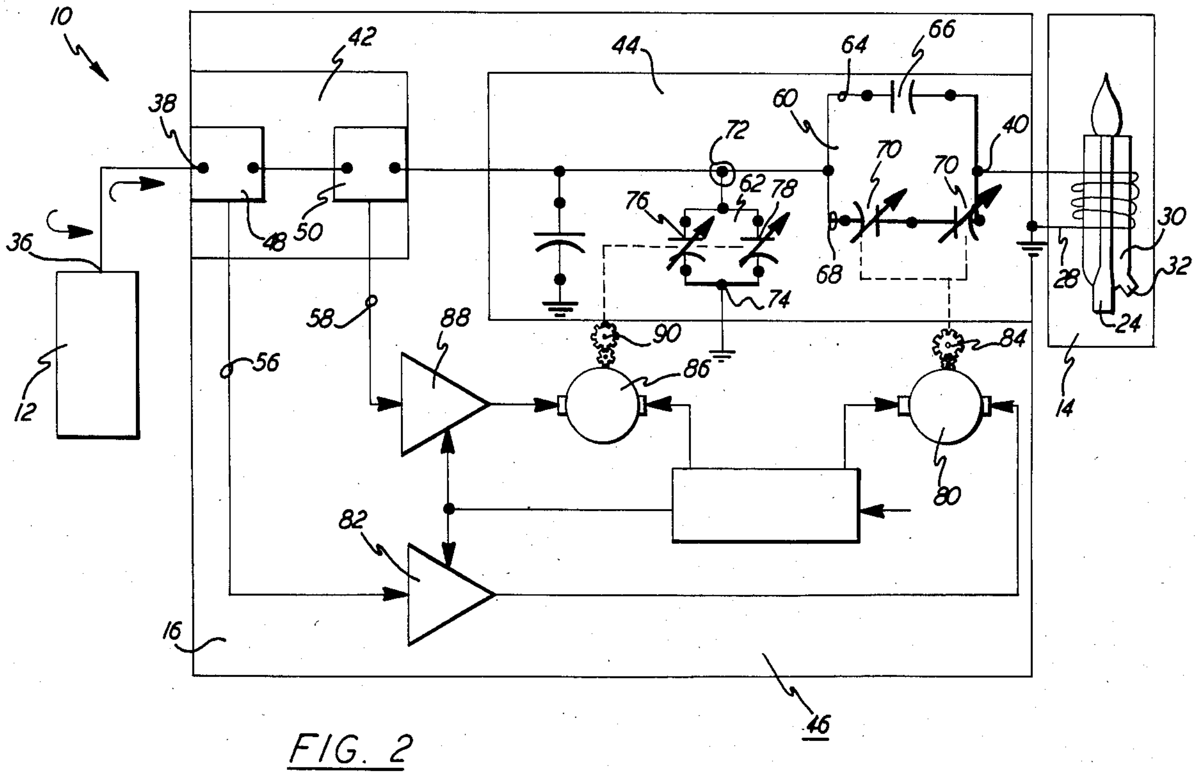
FIG. 2 which is a block diagram of the plasma emission source shown in FIG. 1 having a detailed diagram of the impedance matching network thereof.

Referring specifically to FIG. 2 of the drawing, the impedance matching network 16 is shown in more detail, and includes a dual phase detector network 42, a variable impedance network 44 and a control unit 46. The dual phase detector network 42 is connected to the input 38 of the impedance matching network 16 and serially connected to the variable impedance network 44 which network 44 feeds the load coil 28.

Figure 3:
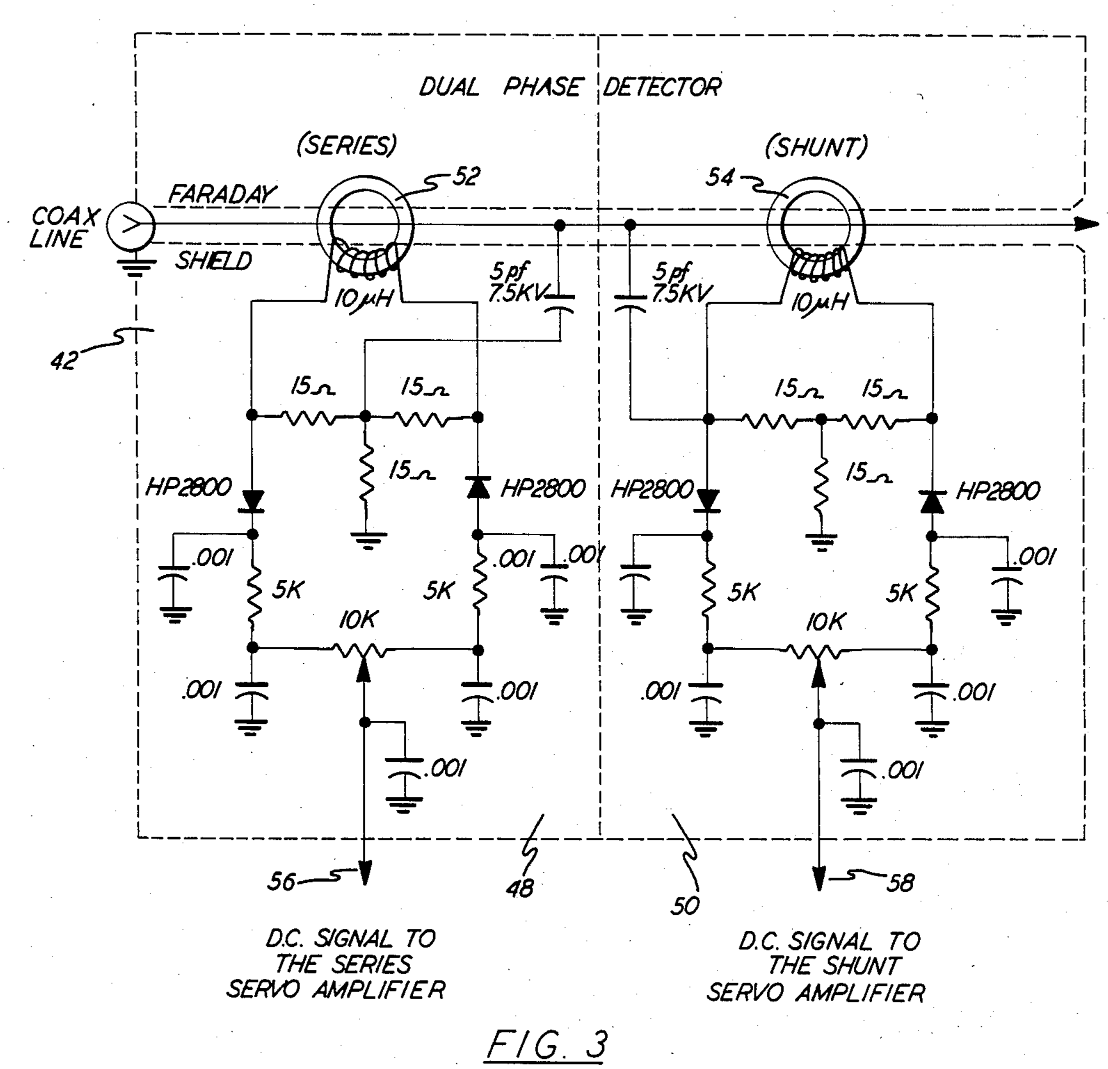
FIG. 3 which is a schematic diagram of a dual phase detector useful in the source shown in FIGS. 1 and 2.

The phase detector network 42 includes a series phase detector 48 and a shunt phase detector 50. The series and shunt phase detectors, 48 and 50 respectively, are shown in the detailed schematic of FIG. 3. As shown in FIG. 3, the detector, 48 and 50 each include a pick-up coil, 52 and 54 respectively, which sense the phase of the voltage and phase of the current. If there is no phase difference then the coil 28 is exactly matched to the generator 12 and maximum power transfer occurs. However, when a phase change occurs, for example due to a change in an operating parameter, a signal is produced at the outputs, 56 and 58, of the series and shunt detectors, 48 and 50, respectively. These signals function as input signals to the control unit 46.

The variable impedance network 44 includes a series capacitor network 60 and a shunt capacitor network 62.

In the preferred embodiment the series capacitor network 60 is serially connected between the dual phase detector network 42 and input of the load coil 28. The series capacitor network 60 includes a first branch 64 having a fixed capacitor 66 and a second branch 68 having two series variable capacitors, 70. The first and second branches, 64 and 68, respectively, are connected in parallel with each other.

One side 72 of the shunt capacitor network 62 is connected between the dual phase detector network 42 and the series capacitor network 60. The other side 74 of the shunt capacitor network 62 is connected to ground in common with the output of the load coil 28. The shunt capacitor network 62 includes first and second variable capacitors, 76 and 78, connected in a parallel circuit.

In the preferred embodiment, the variable capacitor 70 of the series capacitor network 60 have a rated operating range from 5 to 50 picofarads whereas the variable capacitors, 76 and 78 have a rated operating range from 20 to 200 picofarads. It is also preferred that the variable capacitors, 70, 76 and 78 be of the air dielectric type such as those manufactured and marketed by Caywood Company of Malden, Mass.

The control unit 46 includes a first motor 80 controlled by a servo amplifier 82 which servo amplifier 82 is connected to the output 56 of the series phase detector 48. The first motor 80, preferably a d.c. motor, drives the variable capacitors 70 via a gearbox 84. The control unit 46 also includes a second motor 86 controlled by a servo amplifier 88 which servo amplifier 88 is connected to the output 58 of the shunt phase detector 50. The second motor 86 drives the variable capacitors, 76 and 78, via a gearbox 90. The servo amplifiers 82 and 88 are arranged so that direction of the rotation of the motors, 80 and 86 respectively, is dependent upon the polarity of the signals at the outputs, 56 and 58 respectively. Hence, the motors, 80 and 86, are totally responsive to the series and shunt phase detectors, 48 and 50 respectively. Thus, the response of the variable impedance network 44 to impedance mismatching is continuous and automatic.

In operation, the series and shunt phase detectors, 48 and 50 respectively, sample the RF voltage and the RF current. These two parameters sum in accordance with their phase relationship and, when rectified, produce DC voltages indicative of the impedance mismatch by virtue of the incident and reflective power passing through the impedance matching network 16. When the plasma torch 14 is fully matched with the RF generator 12, the incident power is maximum and the reflective power from the torch 14 is zero. If any mismatch occurs in the torch 14 due to changes in operating parameters or the change in nebulizer operating output the impedance across the coil 28 changes. When this occurs the shunt phase detector 50 and the series phase detector 48 due to the reflective power, activate the DC motors 86 and 80, respectively, which change the impedance value of the shunt capacitor network 62 and the series capacitor network 60 to reduce the reflective power to zero. The polarity of the signals from the phase detectors indicate which direction the respected DC motors are rotated in order to match the impedance.

As a consequence of the above described impedance matching network 16, the maintenance of maximum power transfer from the RF generator 12 to the argon plasma torch 14 is fully automated and thereby eliminates and requirement for adjustment by means of a manual mechanism by an operator. The maximization of power transferred to the torch 14 eliminates reflective powers under all conditions and thus ensures maximum energy intensity from the plasma thereby resulting in a higher usable analytical signal to the spectrophotometer. The impedance matching network 16 exhibits the further advantage that, by use of air dielectric capacitors, the adjustment is more rapid than through the use of vacuum capacitors. Hence, the maximization of the response time reduces errors, due to dynamic operational conditions. Further, because the torch is always operating at maximum power transfer there is no need for complex manual readjustment of the impedance matching network when operating conditions change for example, from using an aqueous solvent to an organic solvent.

The present invention has been described herein by use of an exemplary embodiment which is not deemed limited. Thus, the present invention is limited only by the appended claims and the reasonable interpretation thereof.

What is claimed is:

1. A plasma emission source, said source comprising:

a radio-frequency power generator, including an oscillator for generating a radio-frequency signal; and means for amplifing said radio-frequency signal;

a plasma torch, said torch having an RF load coil associated therewith, said coil receiving RF power from said generator; said plasma torch including: a glass chamber having an inlet for gas for forming a plasma and an inlet for a sample mixture which mixture is atomized in said plasma;

means for automatically and continuously maximizing the RF power transferred from said generator to said load coil, said means including: means for continuously monitoring the impedence match between said generator and said coil, said monitoring means producing a signal indicative of an impedance mismatch; and means responsive to said signal, for automatically matching the impedance of said generator and said coil;

said continuously monitoring means including: a dual phase detector network, said dual phase detector network having a series phase detector and a shunt phase detector, said series phase detector producing a series mismatch signal and said shunt phase detector producing a shunt mismatch signal;

said automatic matching means including: a variable impedance network; and a control unit, said control unit being responsive to said signal and controlling the impedance of said variable impedance network;

said variable impedance network including: a series variable impedance network; and a shunt variable impedance network;

said control unit including: a series variable impedance network control motor, said series control motor being responsive to said series detector signal; and a shunt variable impedance network control motor, said shunt control motor being responsive to said shunt detector signal;

said series variable impedance network including two serially connected variable capacitors in parallel with a fixed capacitor; and said shunt variable impedance network including two parallel connected variable capacitors; and said series and said shunt variable capacitors being air dielectric capacitors.

* * * * *